United States Patent
Mahoney et al.

(10) Patent No.: US 8,545,669 B2
(45) Date of Patent: *Oct. 1, 2013

(54) SENSOR ARRAY FOR MEASURING PLASMA CHARACTERISTICS IN PLASMA PROCESSING ENVIRONMENTS

(75) Inventors: Leonard J. Mahoney, Fort Collins, CO (US); Carl W. Almgren, Fort Collins, CO (US); Gregory A. Roche, Fort Collins, CO (US); William W. Saylor, Windsor, CO (US); William D. Sproul, Fort Collins, CO (US); Hendrik V. Walde, Fort Collins, CO (US)

(73) Assignee: KLA-Tencor Corporation, San Jose, CA (US)

( * ) Notice: Subject to any disclaimer, the term of this patent is extended or adjusted under 35 U.S.C. 154(b) by 1720 days.

This patent is subject to a terminal disclaimer.

(21) Appl. No.: 11/066,520

(22) Filed: Feb. 25, 2005

(65) Prior Publication Data

US 2005/0151544 A1 Jul. 14, 2005

Related U.S. Application Data

(63) Continuation of application No. 10/640,892, filed on Aug. 14, 2003, now Pat. No. 6,902,646.

(51) Int. Cl.
*H01L 21/306* (2006.01)
*C23F 1/00* (2006.01)

(52) U.S. Cl.
USPC ............ 156/345.24; 156/345.25; 156/345.26; 216/69; 438/7

(58) Field of Classification Search
USPC ............. 156/345.24, 345.25, 345.26, 345.27, 156/345.28; 118/712; 216/59, 67; 315/111.01; 204/298.03; 438/7
See application file for complete search history.

(56) References Cited

U.S. PATENT DOCUMENTS 4,006,404 A 2/1977 Szuszczewicz et al.
5,167,748 A 12/1992 Hall
(Continued)

FOREIGN PATENT DOCUMENTS

CN 1165952 9/2004
TW 406331 9/2000
(Continued)

OTHER PUBLICATIONS

Mason Freed et al—Autonomous On-wafer Sensors for Process Modeling, Diagnosis, and Control IEEE Transactions on Semiconductor Manufacturing vol. 13, No. 3, Aug. 2001 pp. 255-264.*

(Continued)

*Primary Examiner* — Rakesh Dhingra
(74) *Attorney, Agent, or Firm* — Joshua D. Isenberg; JDI Patent

(57) ABSTRACT

A plasma processing system is provided with diagnostic apparatus for making in-situ measurements of plasma properties. The diagnostic apparatus generally comprises a non-invasive sensor array disposed within a plasma processing chamber, an electrical circuit for stimulating the sensors, and means for recording and communicating sensor measurements for monitoring or control of the plasma process. In one form, the sensors are dynamically pulsed dual floating Langmuir probes that measure incident charged particle currents and electron temperatures in proximity to the plasma boundary or boundaries within the processing system. The plasma measurements may be used to monitor the condition of the processing plasma or furnished to a process system controller for use in controlling the plasma process.

26 Claims, 13 Drawing Sheets

(56) References Cited

U.S. PATENT DOCUMENTS

| | | | |
|---|---|---|---|
| 5,242,561 | A | 9/1993 | Sato |
| 5,339,039 | A | 8/1994 | Carlile et al. |
| 5,451,784 | A | 9/1995 | Loewenhardt et al. |
| 5,467,013 | A | 11/1995 | Williams et al. |
| 5,471,115 | A | 11/1995 | Hikosaka |
| 5,667,701 | A | 9/1997 | Sato et al. |
| 5,885,402 | A | 3/1999 | Esquibel |
| 5,936,413 | A | 8/1999 | Booth et al. |
| 5,971,591 | A | 10/1999 | Vona et al. |
| 5,989,349 | A | 11/1999 | Ke et al. |
| 6,050,218 | A | 4/2000 | Chen et al. |
| 6,113,733 | A | 9/2000 | Eriguchi et al. |
| 6,339,297 | B1 | 1/2002 | Sugai et al. |
| 6,450,184 | B1 * | 9/2002 | Azar ............... 134/57 R |
| 6,458,238 | B1 | 10/2002 | Mente et al. |
| 6,458,239 | B1 | 10/2002 | Bhardwaj et al. |
| 6,576,922 | B1 | 6/2003 | Ma et al. |
| 6,602,384 | B2 | 8/2003 | Bhardwaj et al. |
| 6,614,051 | B1 | 9/2003 | Ma |
| 6,653,852 | B1 * | 11/2003 | Benjamin ............... 324/754 |
| 6,706,541 | B1 | 3/2004 | Toprac et al. |
| 6,771,481 | B2 * | 8/2004 | Nishio et al. ............... 361/234 |
| 2002/0029851 | A1 * | 3/2002 | Edamura et al. ............... 156/345 |
| 2002/0173059 | A1 | 11/2002 | Ma |
| 2003/0052259 | A1 | 3/2003 | Bayer et al. |
| 2003/0141821 | A1 | 7/2003 | Nakano et al. |
| 2003/0193010 | A1 | 10/2003 | Tsay et al. |
| 2004/0016402 | A1 | 1/2004 | Walther et al. |
| 2004/0127031 | A1 * | 7/2004 | Klekotka ............... 438/689 |

FOREIGN PATENT DOCUMENTS

| | | |
|---|---|---|
| TW | 200302683 A | 8/2003 |
| WO | WO 91/09150 | 6/1991 |

OTHER PUBLICATIONS

"Swift and Schwar, Electric Probes for Plasma Diagnostics, (American Elsevier, New York, 1969)".*

Swift, J.D. and Schwar, M.J.R., "Electric Probes for Plasma Diagnostics", Chapter 7—Floating Probe Methods—pp. 137-155, (Elsevier, N.Y., 1969).

English translation of an Office Action dated Jul. 2, 2010 issued for Taiwan Patent Application No. 93123887.

Office Action dated Jun. 29, 2010 issued for Japanese Patent Application No. P2006-523362.

* cited by examiner

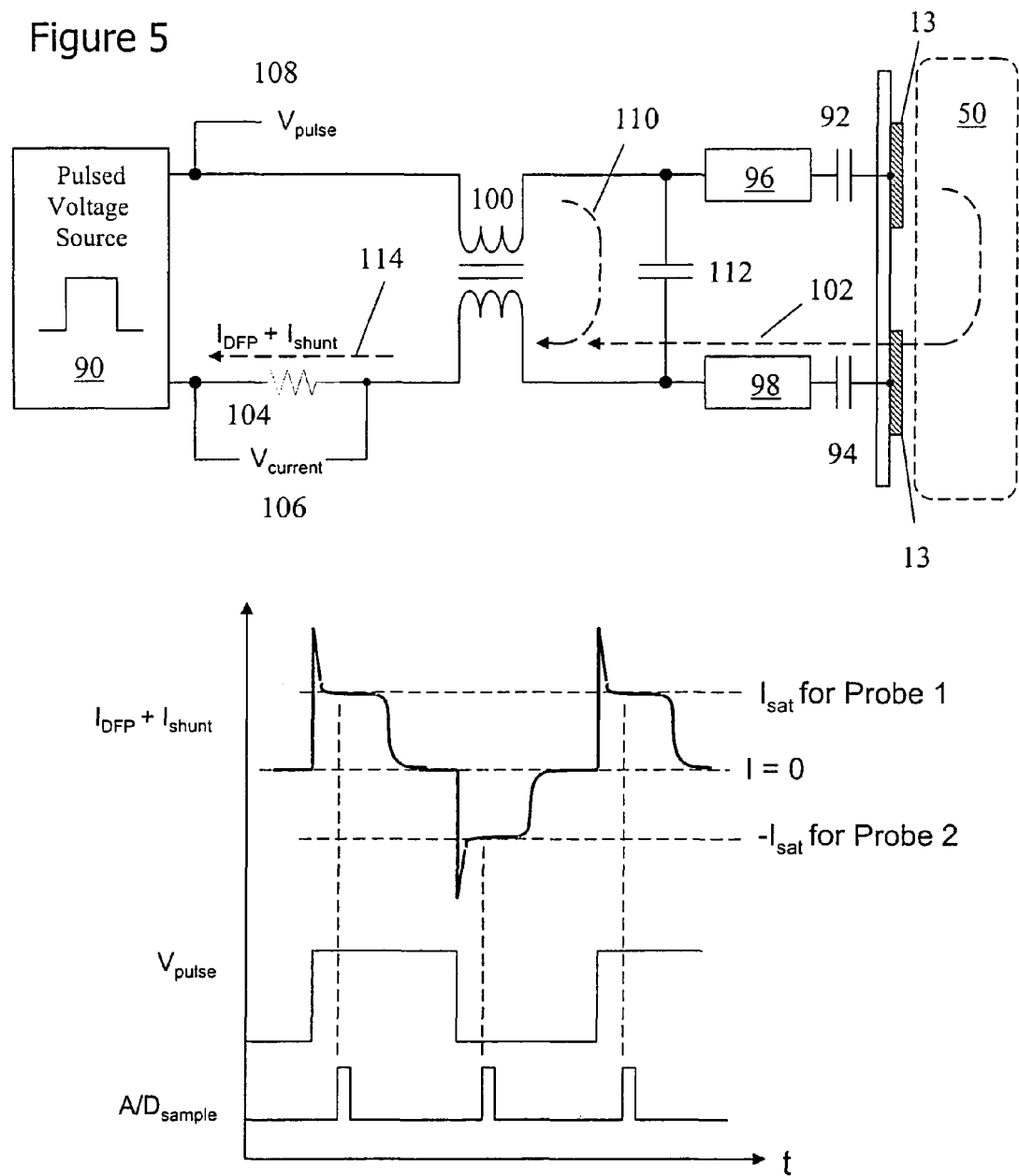

IC Wafers

SENSOR ARRAY FOR MEASURING PLASMA CHARACTERISTICS IN PLASMA PROCESSING ENVIRONMENTS

This application is a continuation application of, and claims the benefit and priority of, U.S. patent application Ser. No. 10/640,892 filed on Aug. 14, 2003 now U.S. Pat. No. 6,902,646.

BACKGROUND OF THE INVENTION

1. Field of the Invention

This invention relates generally to plasma processing systems, and more particularly to apparatus and methods for making in-situ measurements of plasma properties in plasma processing systems.

2. Brief Description of the Prior Art

Single-ended Langmuir probes and other diagnostic probe methods have been widely used in industry to characterize plasmas, and more specifically plasmas used in low pressure vacuum processing systems. Measurement techniques have been described in reference books including Swift and Schwar, *Electric Probes for Plasma Diagnostics*, (American Elsevier, New York, 1969) and by Hershkowitz in *Plasma Diagnostic*, Vol. 1, *Discharge Parameters and Chemistry*, ed. Aucciello and Flamm (Academic, New York, 1989), pp. 113-183. The use of single-ended Langmuir probe diagnostic methods for monitoring plasma processing environments is also known, along with methods for operating the probes as generally needed for plasma characterization. For example, in U.S. Pat. No. 4,006,404, Szuszczewicz et al. discuss excitation of a single-ended Langmuir probe through pulsed modulation so as to avoid problems associated with sampling and surface contamination. In U.S. Pat. No. 5,339,039, Carlile et al. describe a single-ended Langmuir probe system that incorporates radio frequency (RF) compensation and tuned-filtering for operation in RF powered plasma environments. In U.S. Pat. No. 5,167,748, Hall describes using one or more single-ended Langmuir probes to measure charged particle density and electron temperature in order to monitor the state of the plasma and thereby control the plasma geometry within a processing system.

More recently, diagnostic probe assemblies on various components of plasma-based processing systems, such as low pressure semiconductor processing chambers, have been described. Exemplary of this work is U.S. Pat. No. 5,451,784 to Loewenhardt et al., wherein plasma probes and ion energy analyzers are include on a composite diagnostic wafer that is then disposed into a plasma processing system in order to characterize the plasma properties adjacent to the workpiece surface. Similarly, Ke et al. in U.S. Pat. No. 5,989,349 describe the use of planar probes embedded in a semiconductor wafer process diagnostic pedestal for the purpose of monitoring ion currents from the plasma and DC bias potentials. Hikosaka, et al. in U.S. Pat. No. 5,471,115, describe a method for measuring plasma properties using a high frequency plasma oscillation probe that measures absolute electron density in the plasma, with the intent to feed such information back to a main control system that can adjust RF power, gas flows or operating pressure. Also, Booth et al. in U.S. Pat. No. 5,936,413 describe using a capacitively isolated, single-ended planar probe that is excited with an RF voltage waveform to obtain plasma characteristics while avoiding deposition and probe surface contamination and disruption of the processing plasma.

All of the techniques described above have limitations that restrict their usefulness in obtaining real-time measurements of plasma conditions within commercial plasma processing systems. Many of these measuring devices are intrusive in that they require the use of a probe that protrudes into the plasma body, which inherently disrupts the plasma properties when processing materials. Moreover, the use of any single-ended probe is intrusive, particularly when the probe is forward biased at or near the plasma potential, resulting in a condition that necessarily disrupts the electrical structure of the plasma body during processing. Many of the techniques described are intended for experimental characterization of non-corrosive or non-depositing plasmas, and are thus not intended to collect plasma measurements under commercial processing conditions. Finally, these teachings typically provide only a single-point approach to monitoring the plasma properties, and as such provide no means of determining the global or spatial properties of the processing plasma at its boundary.

SUMMARY OF THE INVENTION

This invention provides apparatus and methods for making in-situ measurements of plasma properties in plasma processing systems. The diagnostic apparatus is virtually non-invasive, and can be configured to serve a broad range of needs for monitoring the properties of processing plasmas and to provide data on those properties in a manner required for process control. The apparatus generally comprises a physical sensor array disposed within a plasma processing chamber, an electrical circuit for stimulating the sensors, and means for recording and communicating sensor measurements for monitoring or control of the plasma process.

In one embodiment of the invention, an array of dual floating Langmuir probe (DFP) sensors is disposed within a plasma processing system. The DFP sensors measure incident charged particle currents and electron temperatures in proximity to the plasma boundary or boundaries within the processing system. The DFP sensors are electrostatically floated with respect to the plasma potential so as to cause minimal perturbation of the plasma medium. As a result, the measurement apparatus is non-invasive to the plasma process. Sensor arrays of the invention may also comprise, for example, optical sensors for measuring plasma optical emission spectroscopy and particle light scattering; photo sensors for absorption spectroscopy; thermal sensors for wall temperature and surface temperature chemical catalytic sensing; surface acoustic wave sensors for measuring pressure, film thickness and deposition rates; and micro-electromechanical systems for tactile chemical sensing, mass spectrometry, ion energy and vibration measurements.

In one embodiment of the invention, the diagnostic sensors are disposed along a portion of the chamber liner of a vacuum processing system. In other embodiments, the sensor array may be disposed about the dielectric isolation ring (or "focus ring") of the chamber, a gas injection ring, or upon a portion of a substrate holder or "chuck." The sensors may also be disposed within the wall of the chamber. The sensor devices may be made removable and separable from driving electronics and electrical feed-throughs for servicing or replacement.

By utilizing an array of sensors, the invention provides an ability to obtain diagnostic data, such as ion current flux and effective electron temperature, from multiple locations about the boundary of the plasma body. The invention also provides an ability to monitor boundary properties of a processing plasma about multiple boundaries of the plasma body. In this way, the invention provides for acquiring data that may be used to deduce the global or spatial properties of the plasma, and variations in those properties, in order to monitor and control the process.

The diagnostic sensors of the invention are suitable for use in plasma processing systems where either a protective layer is required within the chamber to inhibit corrosive chemical attack, as would typically be the case in an etching process, or where optically opaque or electrically insulating films or coatings are formed, as in a deposition process. Even with the presence of a dielectric layer atop the sensors, in the form of a coating or deposited film, the sensors remain capacitively coupled to the electrical environment of the plasma when taking measurements of the plasma properties. The invention may thus be adapted for use in a variety of plasma processing systems, including systems used for etching, plasma-enhanced chemical vapor deposition, reactive sputter deposition and conductive sputter deposition.

In one embodiment of the invention, a multi-channel (multiplexed) circuit provides electrical stimuli to the sensors of the array. The sensors may be driven by various alternating excitation waveforms, such as a sinusoid signal, a bipolar pulsed-signal, or a small amplitude saw-tooth signal. The sensors may be stimulated directly or through a capacitive or transformer-isolated electrical connection. Embodiments of the invention also include means of controlling the multiplexing of the sensors, and of filtering out unwanted RF signals that originate from the plasma which might otherwise distort the diagnostic measurements.

The invention also provides an ability to obtain diagnostic data in plasma processing systems that use pulsed RF or pulsed DC power. In one embodiment of the invention, stimulation of and acquisition of data from the sensors is linked or gated to the periodic pulsing of an RF power supply powering the plasma. Measurements of plasma properties may be acquired during both the on-time and off-time of the RF pulses. In this manner, for example, time constants of the plasma source system, such as charged particle density rise and decay times, may be deduced. In another embodiment of the invention, the stimulation and reading of the sensors is linked or gated to the periodic pulsing of a DC power supply powering the plasma. In this instance, the measurements may be acquired during the "−DC on-time" or the "+DC reverse-time" commonly associated with DC-pulsed plasma operation. For both pulsed RF and pulsed DC systems, the dynamics of charged particle density, apparent electron energy and various plasma system time constants may be sensed.

The sensor arrays and other apparatus of the invention are useful for making measurements of sufficient speed and sensitivity to monitor the state of the process plasma in real-time, and to enable sensory feedback for control of the plasma processing system and its subsystems. In one method provided by the invention, signals from a sensor array are recorded and stored as a matrix, with each element of the matrix representing information associated with particular sensor pairs of the array. The matrix of terms may then be evaluated to determine spatial properties of the plasma as may be required to provide real-time monitoring of the plasma process, or for real-time feedback through the action of an external control system.

The present invention may have application in any type of low-pressure plasma-based processing system. Examples include any IC wafer processing system, a single or multiple memory disk coating system, an optical electronic processing system, a stationary or moving glass cleaning, etching or coating system, a web coating or surface treatment system, or any plasma processing system in which working gases or workpieces are treated by a plasma. Moreover, the present invention applies to processing systems whose function is to excite gases via a plasma that are disposed into the system or even for the purpose of producing radiative photonic emissions such as UV light.

BRIEF DESCRIPTION OF THE DRAWINGS

FIG. 5 is a schematic representation of a circuit for obtaining plasma currents from DFP sensors in accordance with some embodiments of the invention, and a typical current response of the sensors.

DETAILED DESCRIPTION

Figure 1:
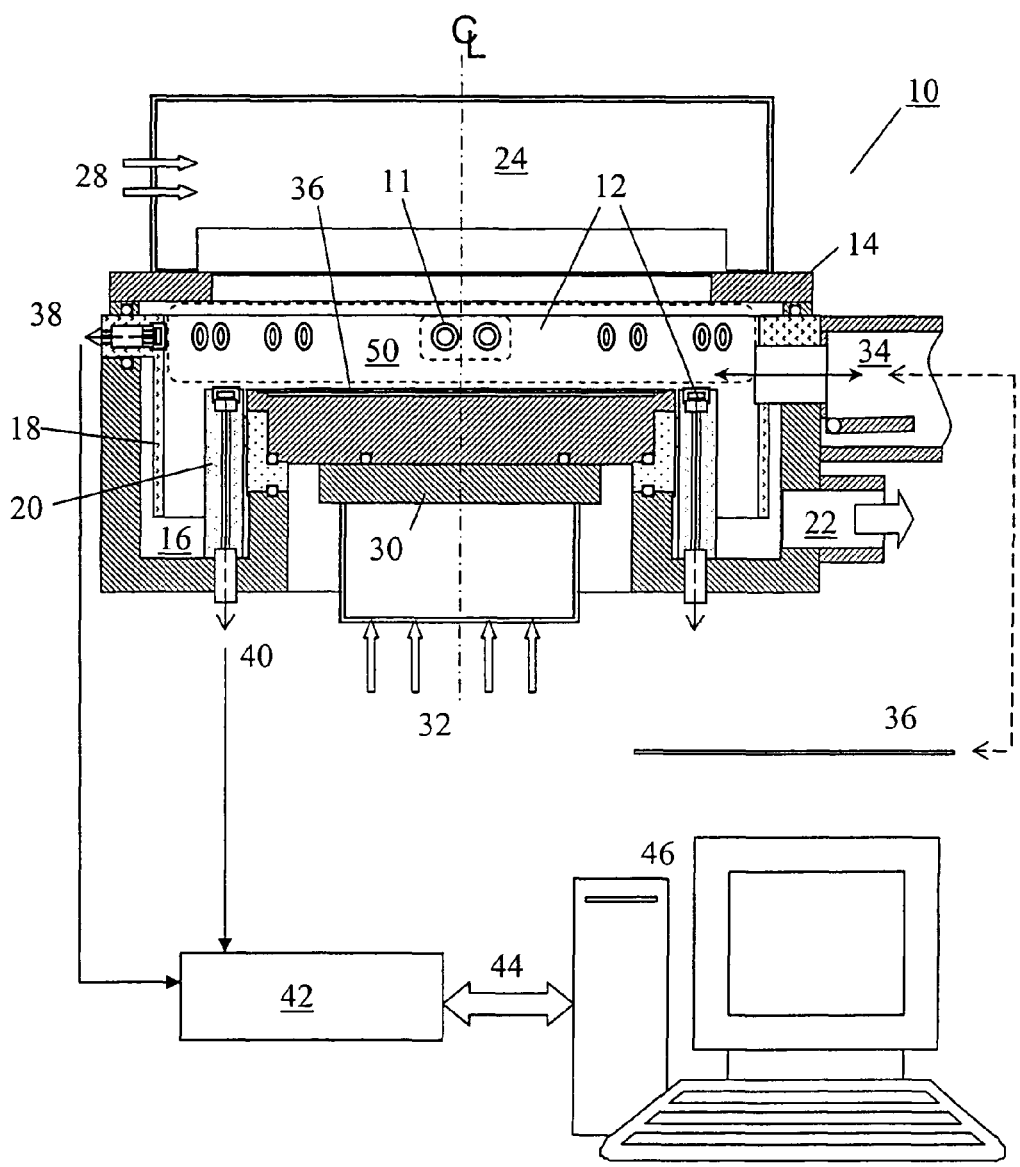
FIG. 1 illustrates a simplified cross-sectional view of a plasma-based manufacturing process chamber comprising sensor apparatus in accordance with one embodiment of the invention.

FIG. 1 illustrates one embodiment of an apparatus 10 that is capable of making real-time measurements of incident plasma current fluxes through arrays 12 of dual floating Langmuir probe (DFP) sensors 11 about the internal boundaries of a plasma processing system 14. In this particular illustration, two sensor arrays 12 are shown, with one array of DFP sensors disposed along the chamber liner 18, and a second array of DFP sensors disposed along the so-called "focus ring" or dielectric isolation ring 20. The processing system 14 is comprised of a vacuum processing chamber 16, a pumping manifold 22, a plasma source 24 mounted to the top of or in communication with the vacuum chamber 16, a gas delivery manifold or gas shroud (not shown), gas flow, thermal management and power services 28 connecting to the plasma source and system, and a wafer or workpiece chuck or mounting stage 30. In the case of a semiconductor processing system, the workpiece chuck may include a clamping means, RF power, fluid coolant, lifting pin assembly, and helium backside-thermal conduction facilities 32. There may also be included a load lock transfer stage with mechanical robotics 34 to manipulate and position the wafer or workpiece 36. In practice, the sensors of the apparatus 10 may be used with or without the wafer or workpiece 36 actually present within the processing chamber 16.

The outputs 38 and 40 of the DFP sensor arrays are connected to an external electronic subsystem 42 that houses the stimulating electronics, multiplexer, data acquisition and microprocessor controls for the apparatus. The output 44 of the electronic subsystem 42 is then communicated to a central processor or computer 46. Since the DPF sensor apparatus can be operated during an actual process, the central processor or computer 46 can use the data from the apparatus to monitoring the process conditions and to provide real-time feedback and control signals to various inputs to the plasma processing system. The electronic subsystem 42 may be a separate box, a special micro-electronics add-in card associated with another piece of electronic hardware or computer 46. When a low-pressure (<100 Torr) gaseous discharge or plasma 50 is ignited within the processing chamber, the apparatus is used to sense the DFP currents which flow between local DFP sensor pad pairs 11 or, alternatively, the DFP currents that flow between non-local pairs within any combination amid sensor array assemblies 12 about the inner chamber 16. As will be described, the DFP sensors 11 may be directly or capacitively coupled to the bipolar, pulsed excitation from the external electronics 42 and as such can be operated even when insulating coatings are deposited from the plasma process onto the surfaces of the DFP sensors.

Figure 2:
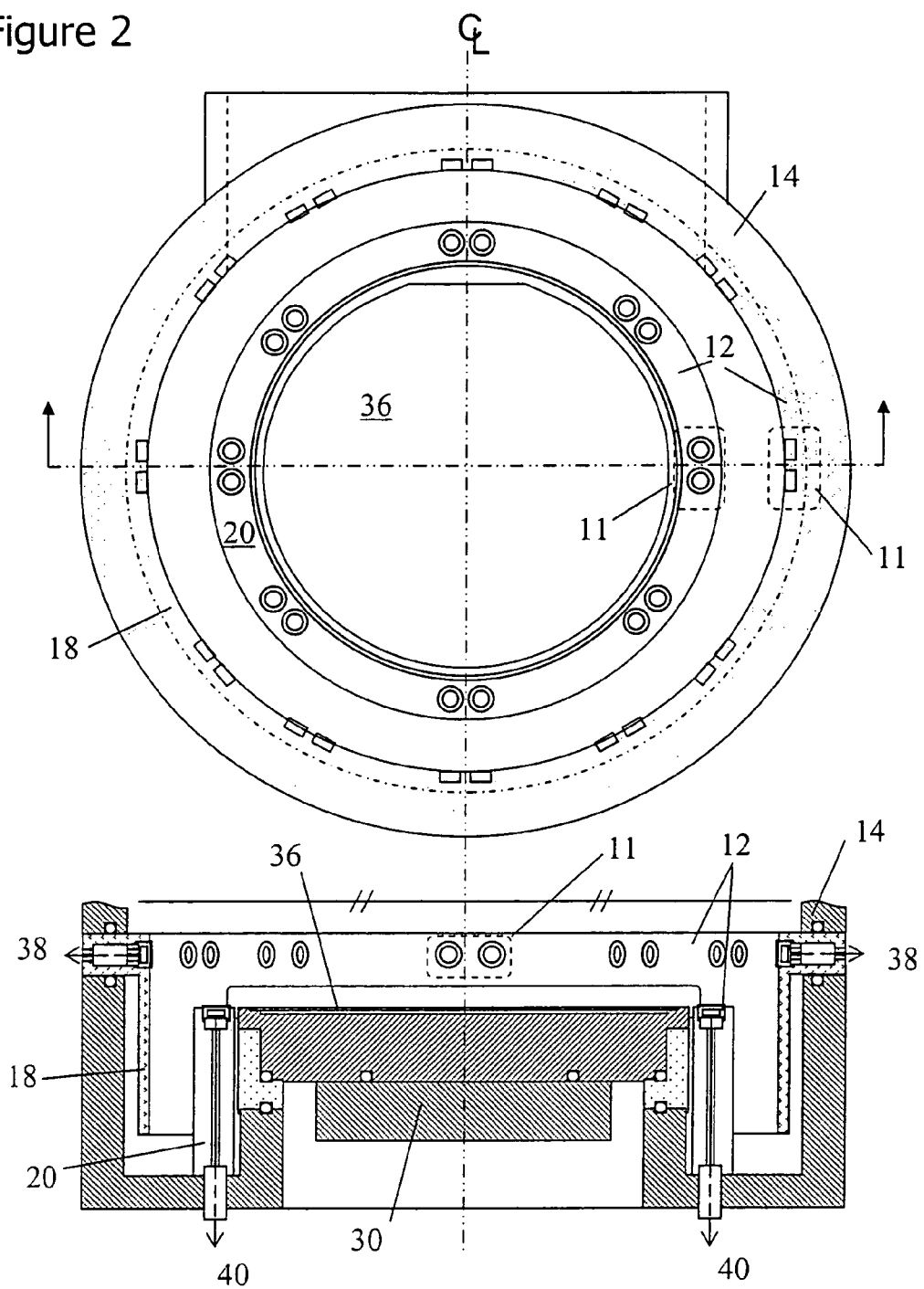
FIG. 2 depicts sensor apparatus in accordance with an embodiment of the invention that includes an array of dual floating Langmuir probes disposed about various components of the plasma chamber.

FIG. 2 is a top view and cross sectional view illustrating an embodiment of a DFP sensor array 12 as disposed in the processing region of a plasma processing chamber 16. In FIG. 2, a semiconductor wafer 36 is disposed in process chamber 16 on a substrate chuck 30. The plasma source (not shown) that powers and sustains the plasma may be of any type, including DC plasma sources, DC- or RF-excited hollow cathode plasma sources, cathodic-arc plasma sources, magnetron sputtering sources, gridded or gridless broad-area ion sources, plasma sources operated with a capacitively driven electrodes, inductively coupled or ferrite-based inductively coupled plasma sources, electron cyclotron resonance microwave plasma sources, surface wave plasma sources, or RF helicon plasma sources.

In the embodiment of FIG. 2, DFP arrays 12 are shown disposed both on a chamber liner 18 as well as imbedded in the dielectric ring 20 that surrounds the substrate holder 30. This ring is sometimes referred to as a "focus ring" in that it constrains the plasma properties and process gas flow dynamics about the edge of the wafer or workpiece. The DFP sensors have electrically isolated, vacuum-sealed connections 38 and 40 that extend outside the vacuum chamber. The DFP probe connections may incorporate passive RF resonant choke filtering elements (not shown) that are used to allow the probes 11 to follow any RF or AC field variations in a manner similar to any other floating surface on the liner 18 or focus ring 20 surfaces. In this manner, any array of DFP sensors 12 can be spatially configured about the interior chamber boundary, although it is preferred that the DFP sensors are in reasonable proximity to either the plasma source (or plasma body) and to the wafer or workpiece 36 being treated within the plasma processing chamber 16.

Figure 3:
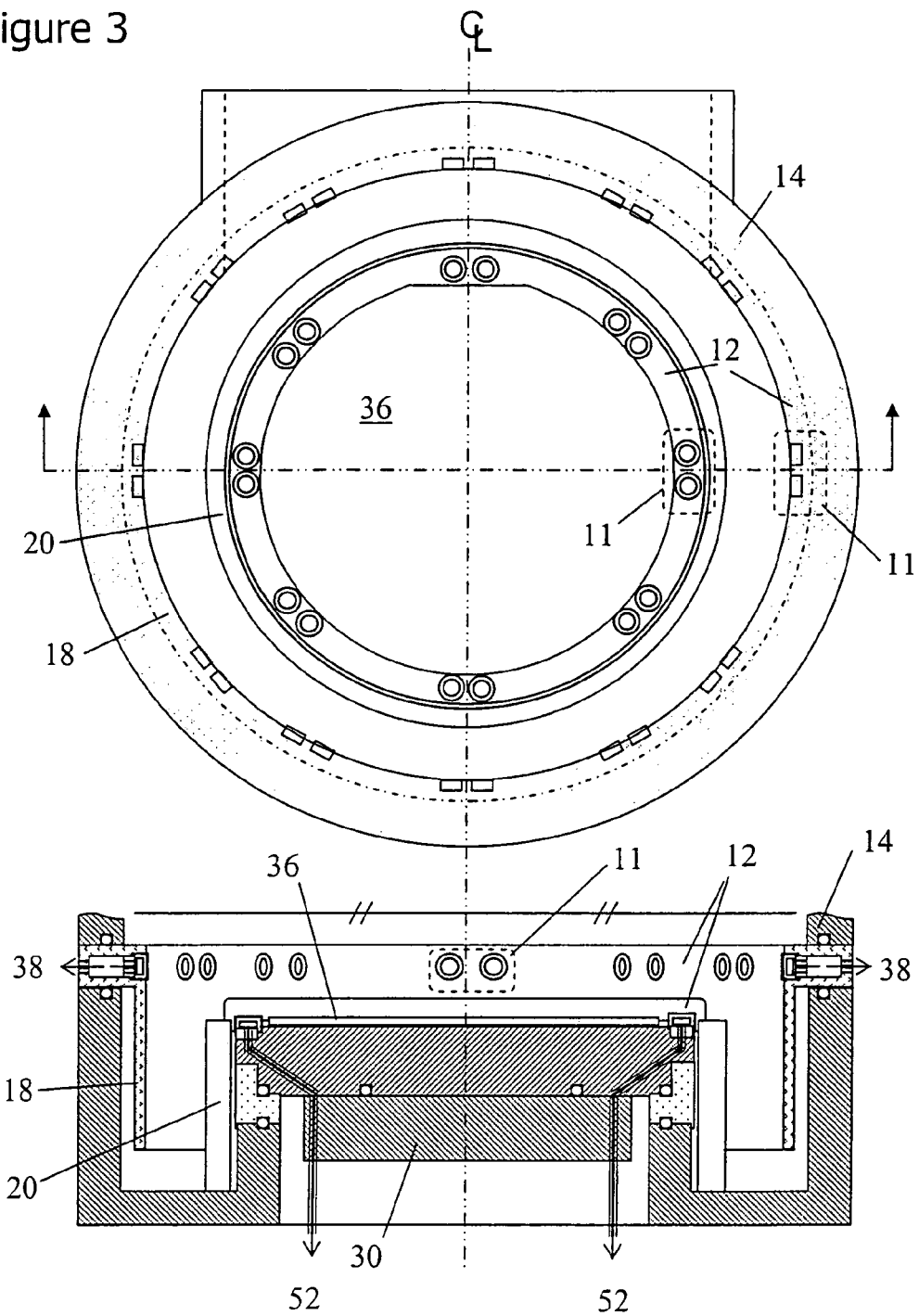
FIG. 3 depicts sensor apparatus in accordance with an embodiment of the invention that includes an array of dual floating Langmuir probes disposed about the plasma chamber and upon a wafer holder that is capable of being electrically biased.

Another embodiment in accordance with the invention is shown in FIG. 3, wherein one sensor array 12 is incorporated into the chuck or holder 30 of the wafer or workpiece 36. Connections 52 to the DFP array on the chuck 30 are routed through the chuck body. Provided that adequate RF filtering (preferably RF-resonant chokes and low-pass filtering) methods are appropriately integrated in-line with the connections to the array 52, the DFP array 12 can function even when the wafer holder 30 is powered with an RF bias as is often required in various semiconductor or materials processing methods. FIG. 3 also shows a secondary DFP array on the chamber liner 18 that may be used in tandem with the array disposed on the wafer or workpiece chuck.

Knowledge of plasma parameters about the boundaries of the plasma body, and their spatial and temporal variations, is helpful in understanding the dynamics of plasma-based processes. Plasma parameters such as ion current flux, charged particle density, electron energies (or apparent electron temperatures) and ion energies are physical parameters of the plasma that directly influence rates and quality of surface modification, deposition or etching. In one embodiment of the invention, the dual floating Langmuir probe (DFP) is used to collect physical parameters of the plasma. The DFP allows measurement of current and voltage (I-V) characteristics of a plasma between two conductive probes that are allowed to electrically float apart from an electrical common or ground.

Figure 4A:
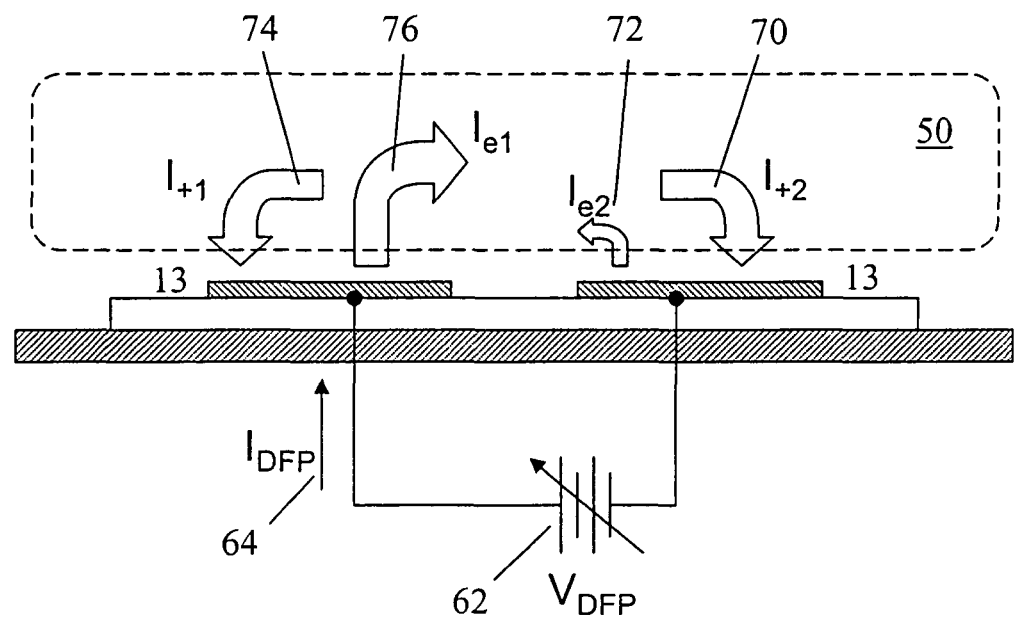
FIG. 4A illustrates a dual floating probe (DFP) structure.
Figure 4B:
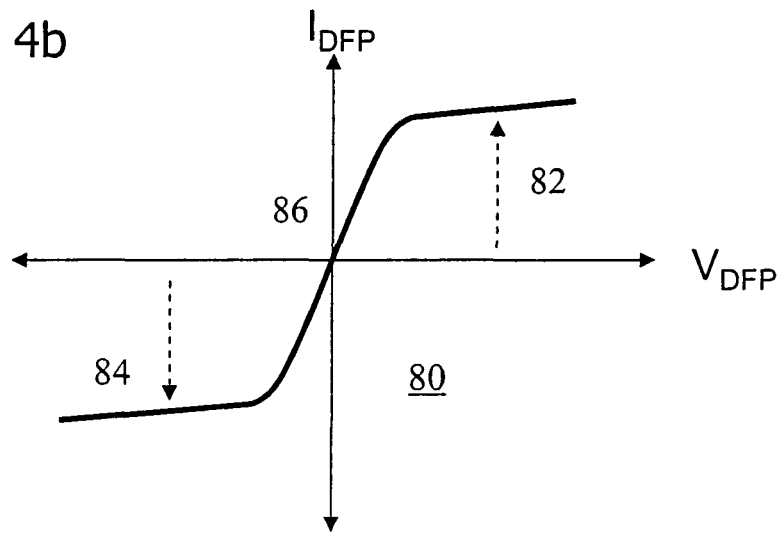
FIG. 4B shows a typical current-voltage response curve of the dual floating probe when exposed to a plasma and voltage bias signal.

FIGS. 4a and 4b illustrate the basic working principles of a single DFP sensor. Two planar conductive probes 13 are exposed to plasma 50. A floating bias potential 62 is induced between the probes to force a net current 64 through the plasma and DFP sensor circuit. When placed at relatively high bias potentials, the net DFP current is limited by ion current flux 70 to the negatively biased probe surface due to the rejection of electron current 72 to the probe; this is known as the ion saturation current. The ion current 74 and electron current 76 to the second probe compensate such that all plasma currents sum to zero to satisfy the floating condition of the probe. When the probes are nearly symmetric in geometry and the plasma has relatively uniform characteristics across the faces of the probe, an I-V trace 80 is produced. As seen in FIG. 4b, the I-V trace of a typical DFP probe has characteristics similar to that of a back-to-back diode pair. The saturating currents 82 and 84 correspond to ion saturation currents 70 and 74 respectively. The intermediate region of the I-V curve 86 is determined by the electron currents 72 and 76 and may be used to determine the apparent electron temperature, $<T_e>$, which is indicative of "high-energy" electron population of the electron energy distribution as manifested at the face of the DFP sensor pads 13.

The current characteristics versus bias voltage for a symmetric dual-floating probe is approximated by $$I_{DFP} \cong I_{sat}^+ \cdot \tanh\left(\frac{e(V_0 - V_{DFP})}{T_e}\right) \qquad (1)$$

where $I^+_{sat}$ is the ion saturation current, $V_0$ is the floating potential of the probes when no bias is applied, $V_{DPF}$ is the differentially applied probe voltage, and $T_e$ is the apparent electron temperature. Equation 1 may be modified to take into account non-ideal situations that include effective probe area expansion with increasing bias potential, asymmetric probe areas, non-uniform plasmas and non-Maxwellian electron energy distributions. The conventional analysis that results in Eq. 1 is for a DC floating DFP case, but is also applicable in plasma environments where strong RF fields are present and where RF filtering is employed to allow the DFP sensor to follow the RF potential fluctuations inherent in the process.

To implement the DFP diagnostic technique on a practical in-situ sensor, it is necessary to provide a floating probe bias means. One example is illustrated in FIG. 5, wherein the DFP sensor pads 13 are powered with a bipolar, square-wave pulsed power source 90. The actual probe faces may be directly connected to the voltage source or may be capacitively coupled through isolation capacitors 92 and 94. The series capacitors 92 and 94 are optional if the square wave pulsing supply is floating. These capacitive elements may also represent any dielectric layer that may appear on the probe surface, as for example in the form of a deposited dielectric film or an anodization coating. In the case where strong RF signals or RF induced self-biases are of concern, series RF resonant choke filters 96 and 98 (i.e. a series of tuned parallel capacitor-inductor elements in series with a low pass filter) can be incorporated to provide high impedance to select RF frequencies and related harmonics. Finally, a common mode choke 100 may be included to block any noise between the leads of the floating sensor.

With the circuitry arrangement of FIG. 5, the DFP sensor pads 13 can be stimulated with a bipolar pulsed signal 90 having a controlled peak-to-peak amplitude. With this stimulus, the DFP sensor provides a current 102 through the plasma 50 that can be sensed as a voltage 104 through across a sampling resistor 106, or alternatively with an emitting diode. The excitation voltage level 108 can be sampled as well. The pulsed excitation can provide a high frequency current component 110 associated with a non-zero shunt capacitance 112 that is related to any parallel parasitic capacitance between the DFP sensor faces or electrical leads. In general it is preferred to keep the shunt capacitance small. Provided that the values of any isolation capacitances 92 and 94 are substantially larger than level of the shunt capacitance 112, the DFP sensor current 102 can be resolved from the total current 114. With appropriate methods of delay, sampling and holding, it is possible then to read the DFP ion saturation current value, even in cases where a thin dielectric coating appears on the surfaces of the DFP sensor pads. Moreover, if the level of the DFP sensor excitation voltage is controlled, it is possible to resolve the I-V characteristics of the DFP sensor, and thereby sense apparent electron temperature levels.

For those cases where the DFP sensor develops a dielectric coating that has a net series capacitance value similar to or lower than the shunt capacitance, it becomes more difficult to separate the shunt current from the DFP sensor current. In processes where thick dielectric films build up on the probe faces, it may be necessary clean the probe face or remove it from the processing system. Thus, it is preferred that the probe faces or array assembly be removable from the processing chamber and that they be fashioned from materials compatible with conventional chamber cleaning methods. For example, in PE-CVD processes that involve the deposition of carbon or silicon, it is helpful to have the DFP probes fabricated from materials that can be cleaned with oxygen- or fluorine-based chemistries, respectively.

Figure 6A:
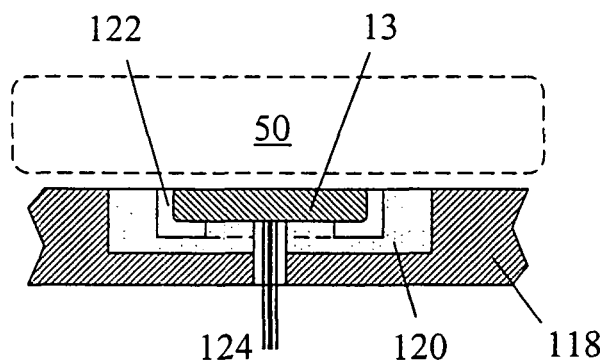
FIG. 6a is a cross section of a DFP device fabricated from a conductive electrode.
Figure 6B:
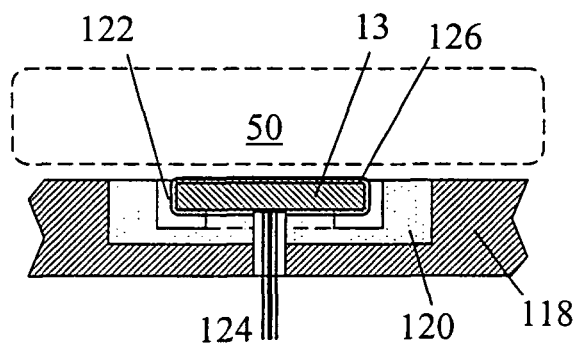
FIG. 6b is a cross section of a DFP device fabricated from an electrode and having an insulating surface or a deposited electrically insulating coating or film.
Figure 6C:
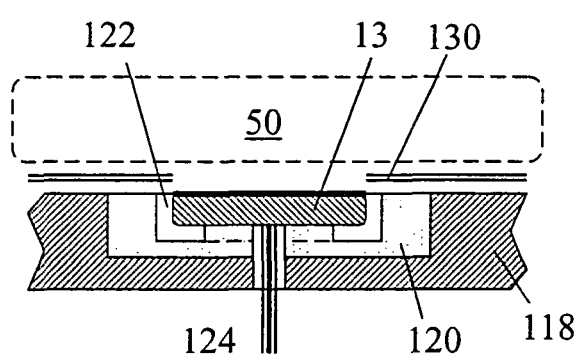
FIG. 6c is a cross section of a DFP device fabricated from an electrode and masked to control the line-of-sight deposition of sputtered or ion-beam deposited coatings or films.

FIGS. 6a, 6b, and 6c show various configurations of DFP sensor pads. FIG. 6a shows a single DFP sensor pad 13 that incorporates a substantially planar probe of about 0.1 to 10 cm$^2$ in area. The probe is electrically isolated from any conductive or anodized boundary on the chamber walls, liner or workpiece chuck as represented by 118 in this illustration. The probe sensor may also include insulators 120 and vacuum gaps 122 that separate the probe spatially from boundary surfaces. The gaps prevent the floating sensor from becoming grounded or capacitively coupled to other conductive boundaries when operating in depositing processes. Gap widths are typically on the order of 1 to 10 Debye lengths of the plasma in proximity to the probe (typically about 0.1 to 1 mm for applicable process conditions). The electrical connection 124 to the sensor pad 13 is located on the backside of the pad with mechanical features that allow the probe to be removed for servicing or replaced, if necessary. FIG. 6b shows the same DPF sensor pad 13 manufactured from a conductive electrode that has a dielectric or anodized layer 126 as may commonly be required in etching or chamber cleaning processes. In FIG. 6c, the DFP sensor includes a forward masking assembly 130 which prevents build up of sputtered, conductive coatings. Without the mask, conductive coatings could build up in the isolation gap and over the surface of the insulator, eventually causing the floating DFP sensor to be shorted to another conductive boundary or cause the collecting area of the planar DFP sensor pad to expand and lead to significant errors in the DFP measurements.

Figure 7:
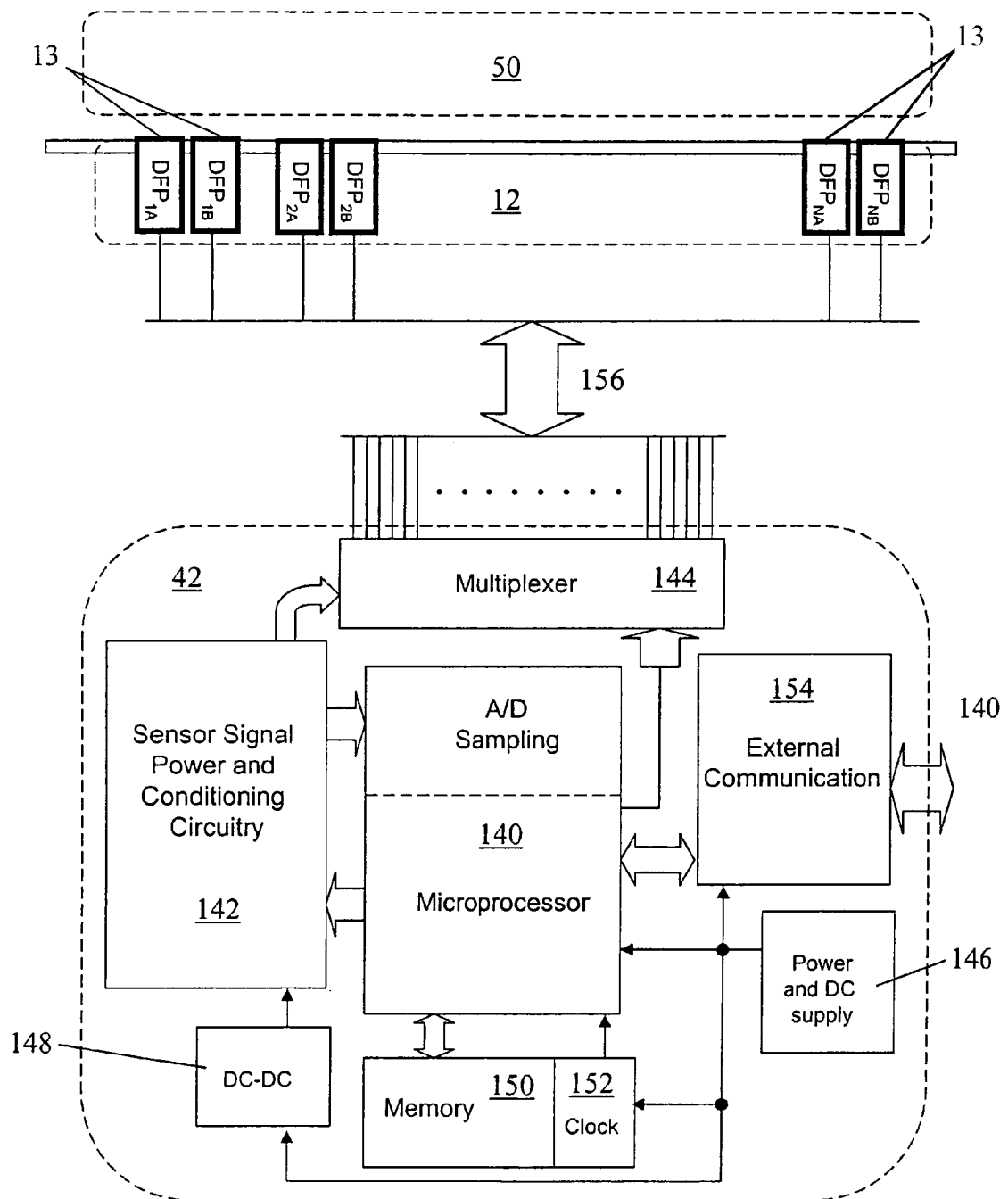
FIG. 7 illustrates a schematic electrical architecture of an embodiment of the invention in which the DFP sensors are multiplexed to a central pulse circuit, a data acquisition circuit, microprocessor, memory, power supply system and external communications.

In order to operate the DFP sensor, an external electronic system 42 is required to provide the probe bias over the array and collect the various DFP currents. One example of the architecture of this circuitry is illustrated in FIG. 7. In this example the external circuit includes a central microprocessor with A/D sampling capability 140, a bipolar-pulsed supply with DFP probe signal conditioning circuit 142, a multiplexer 144, and DC power source 146 and DC-DC converter 148 that condition the input power to the various components in the circuitry. Other components include memory 150, internal clock 152, and external communication electronics 154. The multiplexed circuitry is used to direct the bipolar pulse waveform through wired connections 156 to the appropriate combination of DFP sensor pads 13 on the array 12. External communications with the communication electronics 154 may be by wired or wireless means. Against its own timing or gating, the microprocessor determines when the A/D conversion is performed to avoid high frequency transient errors due to shunt capacitance and to provide sampling and averaging of the DFP currents and bias voltage signals. Note that the circuitry in FIG. 7 does not illustrate the optional common mode chokes, RF filters or isolation capacitors in line with connections 156 that have been described in FIG. 5 in connection with one embodiment of the invention.

Figure 8:
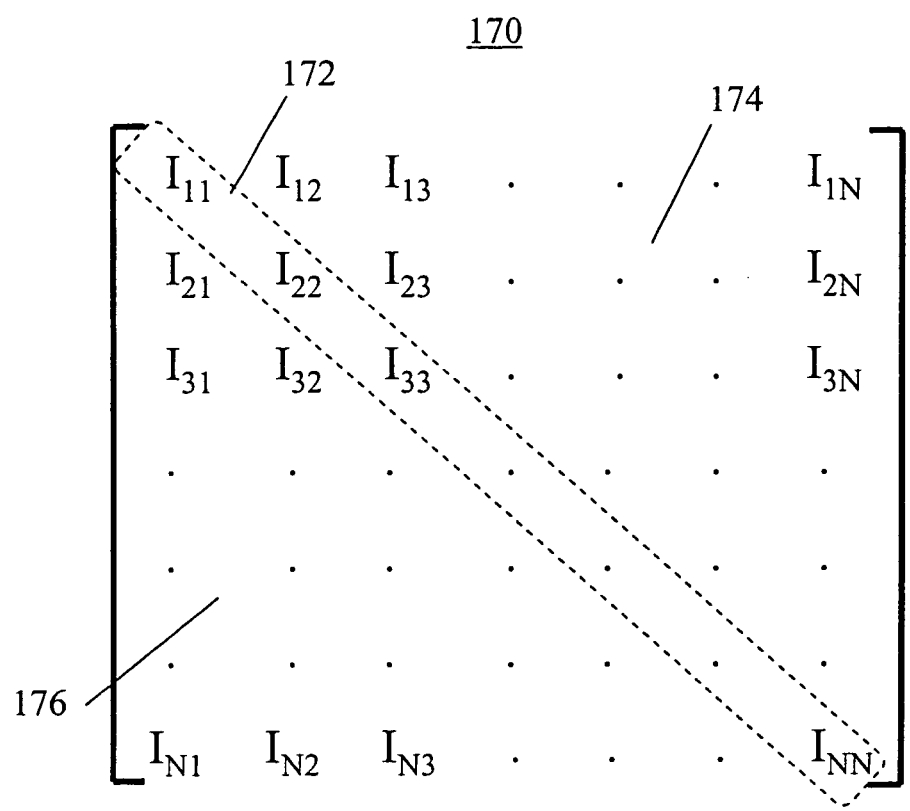
FIG. 8 illustrates a matrix of current measurements made with near-zone DFP pairs and far-zone DFP pairs as sampled about the sensor array.

FIG. 8 shows a matrix of DFP signal data 170 that can be collected by the sensor apparatus of the present invention. For example, each current term along the diagonal of the array, $I_{i,i}$, 172 could represent the average of the ion saturation current amplitudes measured between a local pair of DFP probe sensor pads:

$$I_{i,i} = \frac{|I^{sat}_{1_{i,i}}| + |I^{sat}_{2_{i,i}}|}{2}. \tag{2}$$

The off-diagonal currents, $I_{i,j}$, 174 and 176 could be similarly averaged ion saturation current terms associated with a non-local DFP sensor probes amid the array. These current terms hold additional information on the bulk state of the plasma body since the current stimulated between the probes are non-local and must conduct through a greater portion of the plasma body. Alternatively, the array could also hold effective electron temperature data as reduced from I-V data when the pulse amplitude of $V_{bias}$ is made relatively small.

Mathematical and statistical treatment of the array of current terms 170 can provide sensitive information about the state of the plasma at its boundary and, to a lesser degree, about the bulk conductance of the plasma body. By correlating the output of the array of current terms to either simple or complex power balance models of the plasma, it is possible to use the apparatus to obtain feedback information for real-time process control. For example, feedback information may be used to control the set-point of delivered power into the process. To perform this function, the information taken from multiple DFP I-V sensors may be analyzed through one of many information processing architectures. One source of information consists of the matrix of readings from all of the I-V probes 170. As described earlier, this is a square matrix of M×M rank where M is the number of probe sensors. The diagonal terms 172 are the measurements between the pads of each individual probe sensor and the off-diagonal terms 174 and 176 are the passive measurement at the $i^{th}$ probe sensor from active pulsing of the $j^{th}$ probe sensor. The structure of this matrix may be analyzed by several decomposition techniques such as Cholesky, fractional, QR, Schmidt, triangular, or UD factorizations. Also, singular value decomposition is another technique used to derive eigenvectors and the covariance matrices. This analysis serves as a fingerprint of the process and used to estimate hidden states of the process and plasma. This technique provides a snapshot in time of plasma conditions.

Another construct of the probe data is in an N×M matrix where M is the number of probes and N is the number of temporal data values for each of the M probes. This vector-valued time series is analyzed using typical subspace projection methods common in control engineering applications. The analyses of these signals can also be extended to constructs based on feedback-free exogenous signals that are used in closed-loop control of the process and in developing estimators for unobserved state variables. Extended Kalman filters and nonlinear estimators and filters may also be used to process the data from the matrix of I-V probe readings. The array can be of any dimension with the other vectors being time, excitation voltage, current polarity and the like.

By combining the DFP array apparatus with information processing methods, the apparatus provides process real-time information that can be used to track the state of the plasma dynamically as it may be influenced by process events such as pressure bursts, flow controller over-shooting, transient imbalances of the plasma chemistry, and drifts in net power delivery due to deposition and build-up of coatings and films. Tracking and adjusting for such effects can be realized with the information gathered by the in-situ sensor devices in order to improve run-to-run performance, process adaptation and optimization and troubleshooting of problematic systems, with the goal of increasing product yield and process system up-time.

Figure 9:
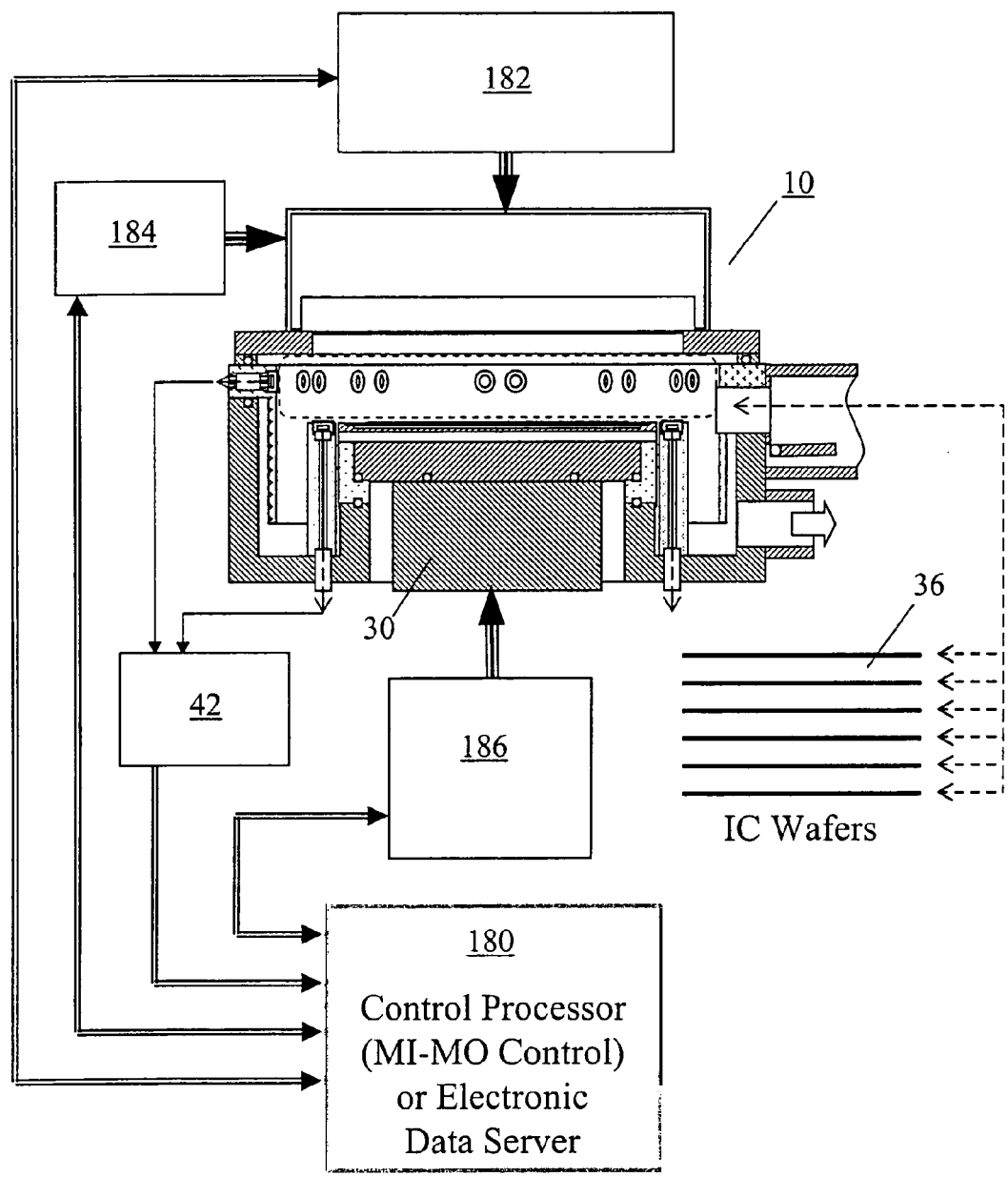
FIG. 9 illustrates a wafer plasma processing system in accordance with an embodiment of the invention wherein conditioned DFP sensor signals are used to monitor or control the plasma state.

FIG. 9 illustrates use of sensor signals to monitor or control the plasma state in a wafer plasma processing system in accordance with an embodiment of the invention. In this embodiment, a plasma processing system 10 used to process integrated circuit wafers 36 comprises sensor arrays 12. An electronic subsystem 42 is provided to process the signals collected from the sensor arrays 12 into sensory feedback information on the boundary state of the plasma, which is furnished in turn to a system controller or electronic data server 180. The processing of the sensory input signals may be accomplished in real time. Using a control algorithm, the system controller 180 uses the feedback information of the invention to adjust input levels of power to the plasma source 182, gas flow levels to the systems mass flow controllers 184, or power and bias levels to the wafer chuck sub-system 186. Other subsystems or factors affected by the controller may include the pressure controller and pumping system and dynamic times of the process steps. Although the processing electronics 42 are shown as a separate electrical entity in FIG. 9, these electronics may alternatively be mechanically combined in part or in total within the features of the system controller (or electronic data server) 180 or configured within the plasma source or wafer chuck subsystem power supply electronics.

By their nature, the DFP sensors provide very low perturbation of the plasma properties when activated and constructed properly. When inactive, the sensors electrically charge to the floating potential as with other dielectrically isolated or anodized surfaces about the process chamber walls. Provided that the probes have a low profile and smooth edges, the probe cannot act as an electrical boundary that would trap large or dusty charged particles which might lead to particle defects in semiconductor, memory or optical product processing.

When a probe is activated, the total energy injected into the plasma is very small. For instance in a process chamber that has an electrodeless discharge that operates at 2 kW, the plasma density would be on the order of $10^{11}$ cm$^{-3}$ and ion saturation current densities of about 1 mA/cm$^2$. Consider the case of an effective pulsed-bias of about +/−40 V at the DFP sensor with a pulsed on-time of about 0.5 msec at a duty cycle of 20% for DFP sensor areas of about 2.5 cm$^2$. For real-time continuous operation, this condition implies a maximum power density of about of 10-20 mW. Even then, this power is not disposed within the bulk plasma; rather, most of it is disposed into heating of the DFP sensor through ion bombardment of the probe surfaces. Finally, since the DFP is a Langmuir probing method that operates in near or below the natural floating potentials of the chamber wall, there is little to no perturbation to the electrostatic structure of the plasma body. Given the above features and considerations, the DFP sensing apparatus affords negligible impact on the plasma-based process while yielding real-time in-situ sensory information about the plasma body to aid in monitoring or controlling aspects of the plasma process conditions.

In the preceding illustrations and examples, the DFP arrays have been represented as comprised of sensors having a pair of similar floating planar sensor pads which in principle have a bipolar current waveform in which $I_{sat}$ of probe 1 is about equal in magnitude to $I_{sat}$ of probe 2 or any other probe disposed symmetrically about the plasma chamber boundaries. However, an alternative variation on this apparatus is to have an array of single DFP sensor pads with a common electron return current pad. In this situation the common pad need not be of equal area of similar mechanical build, as the array of probe sensor pads and the pulsed-signal electronics would be unipolar with additional switching that would allows the pulse circuit to de-charge and re-trigger for each pulsed excitation. This configuration, while somewhat more simple to implement, would provide an array of current terms that would only fill in the diagonal of the current matrix 170 of FIG. 8.

The present invention may also be utilized in plasma processing systems that employ pulsed RF or pulsed DC power operation. When the sensor arrays of the invention are used in pulsed power plasma systems, it is desirable to synchronize the acquisition of data from the sensors with the pulsing dynamics of the plasma processing system. This synchronization is advantageous since the application of pulsed operation induces periodic changes in the charged particle dynamics in the plasma processing system. Without synchronous sampling, the discrete or time-averaged sensor readings would have noise from being aliased against the pulsed power. Also, by using synchronous gating and sampling methods to obtain data within pulsed power applications, estimates of the plasma properties, such as ion saturation current and effective electron energy, can be characterized throughout the pulse period.

Figure 10:
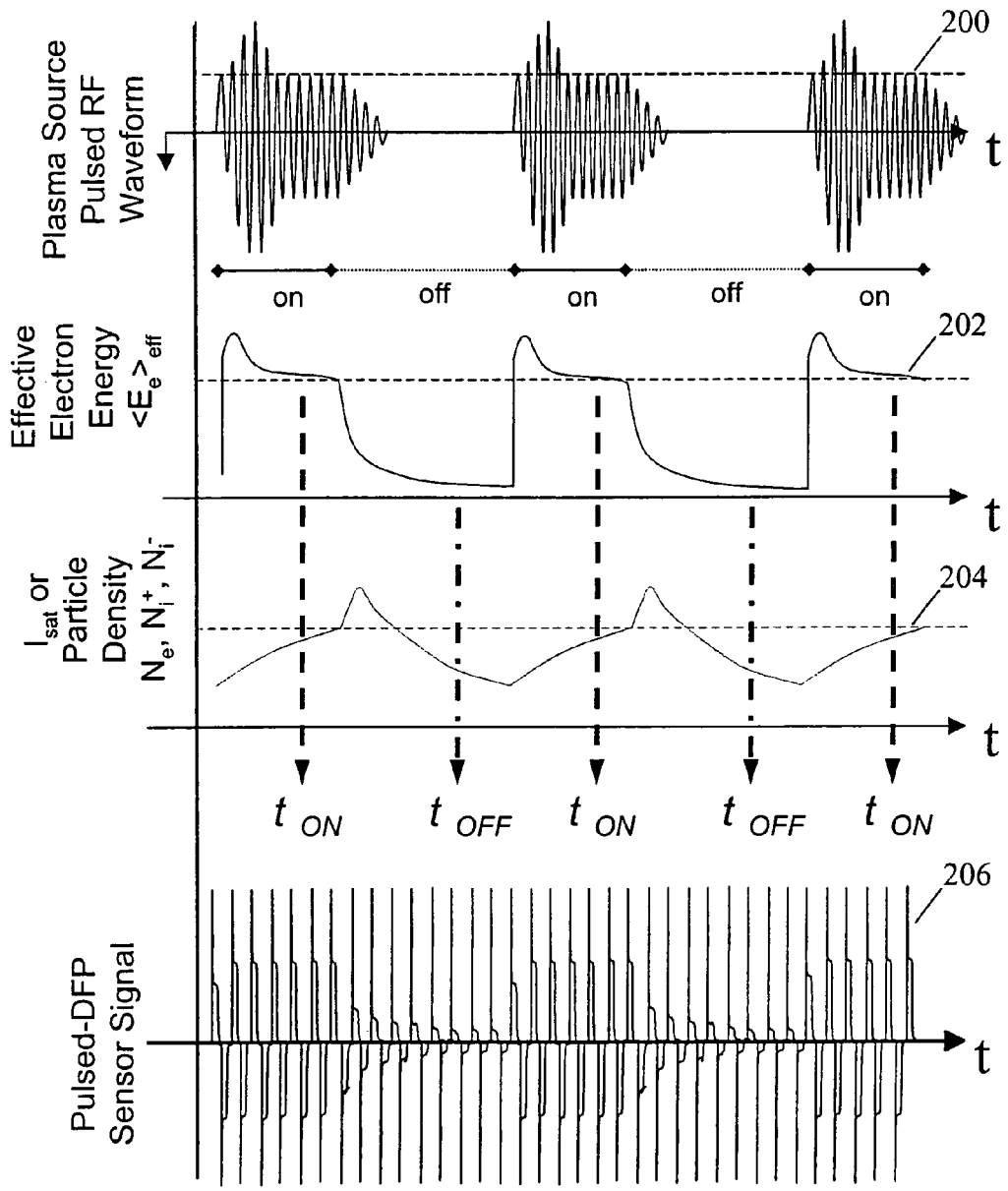
FIG. 10 illustrates typical waveforms from a pulsed RF plasma processing system in accordance with an embodiment of the invention showing dynamics of plasma properties that can be measured by synchronous sampling of DFP sensors within the pulse period.

FIG. 10 illustrates an embodiment of the invention adapted to measure plasma properties in a pulsed RF power plasma processing system. For an RF power waveform envelope 200 typical of that observed during pulsed RF operation, the plasma exhibits time-varying characteristics of effective electron energy 202 and ion saturation current 204. The pulsing frequency of a pulsed RF plasma processing system is typically in the range of about 100 Hz to about 10 kHz, which is less than the preferred excitation frequency of a pulsed DFP sensor of between 1 to 20 kHz. In this case, ion saturation current as measured by a DFP sensor excited with a bipolar pulse would be observed as a signal envelope 206. With appropriate gating, delay and holding of the temporal sensor signal with respect to the system pulsing and sensor excitation frequencies, synchronous sampling of plasma properties throughout the plasma pulse period may be obtained and used to develop dynamic or time-averaged values of the plasma properties. By synchronous triggering on the pulsed RF power timing, noise in the collected sensor readings due to aliasing against the power pulsing is avoided, thus making the readings more representative of the true temporal dynamics of the plasma state.

Figure 11:
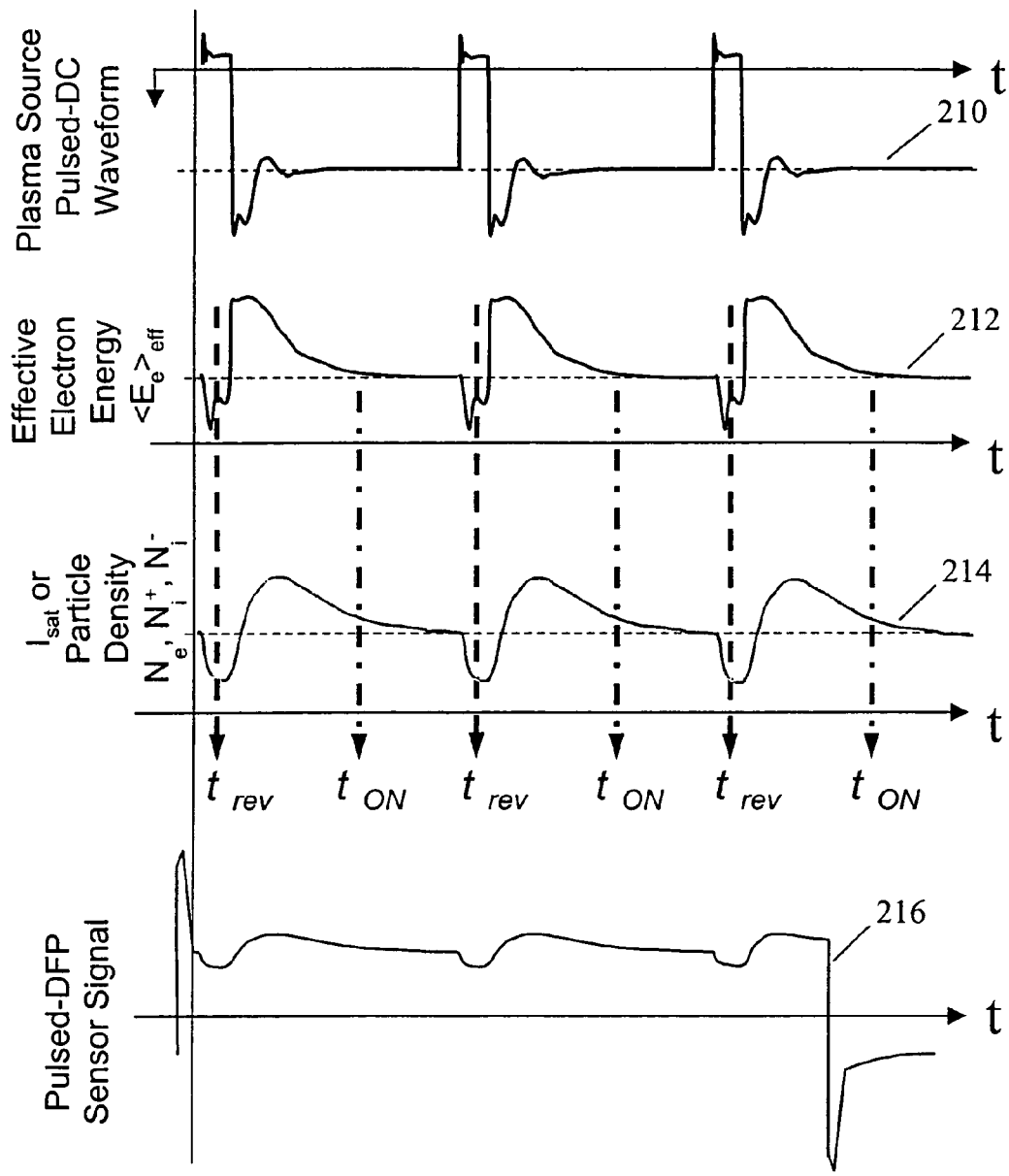
FIG. 11 illustrates typical waveforms from a pulsed DC plasma processing system in accordance with an embodiment of the invention showing plasma properties that can be measured by synchronous sampling of DFP sensors.

FIG. 11 illustrates an embodiment of the invention adapted for use in a pulsed-DC plasma processing system, such as those employed for magnetron sputtering or in broad area ion sources. In these applications the pulsed DC potential 210 is switched briefly from a relatively large negative potential to a reverse potential (i.e. slightly positive), as for example to "de-charge" periodically the cathode surface of the DC plasma source. (An example of this technique is described in U.S. Pat. No. 5,718,813.) Accordingly, the plasma of the system exhibits time-varying characteristics of effective electron energy 212 and ion saturation current 214. In pulsed DC operation, the pulsing frequency may be anywhere in the range of 20 kHz to 400 kHz, which is typically much higher than the preferred excitation frequency of a pulsed DFP sensor. As a result, the dynamic response of the plasma properties are replicated several times within one pulsed DFP time period as shown in waveform 216. With proper control of triggering, gating, and time delay of DFP sensor readings, however, sampling of the sensor signals may be synchronized with features of the pulsed-DC power waveform. In this way, sensor readings may be collected that are less prone to noise and more representative of the true temporal dynamics of the plasma state.

Figure 12:
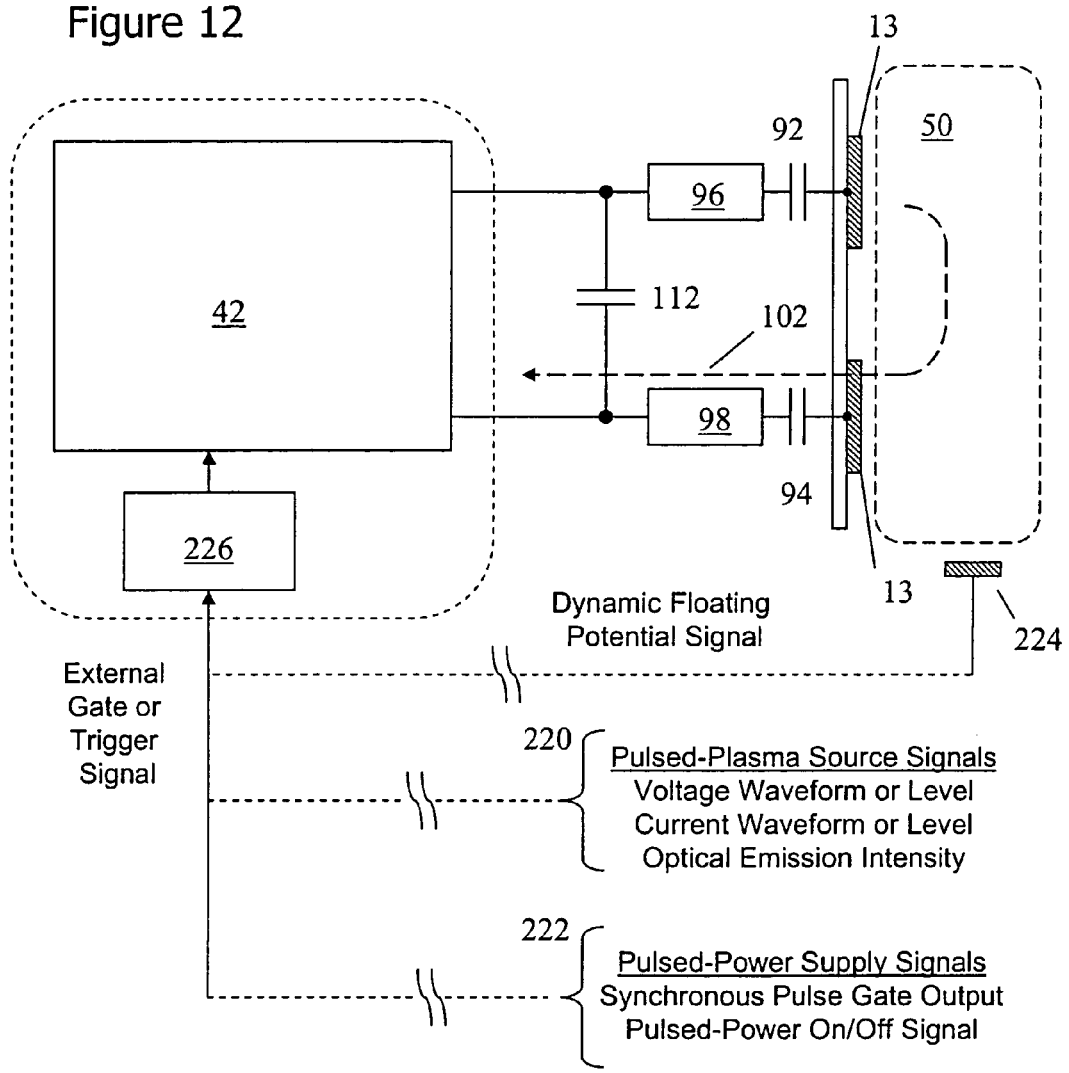
FIG. 12 illustrates examples of trigger or gating signals in pulsed RF or pulsed DC plasma systems in accordance with an embodiment of the invention for the purposes of making synchronous measurements.

In either RF or DC pulsing applications, any number of external signals may be available for triggering or gating synchronous sampling of the sensors of the invention. As illustrated in FIG. 12, in one embodiment, external current and voltage signals 220 from the plasma source apparatus, or from anywhere between the power supply and plasma source, are employed to synchronize sampling of the sensors. Signals representative of the optical emission intensity of the plasma may also be employed. Alternatively, power "ON/OFF" signals or "−DC/+DC" signals 222 available from the internal control circuitry or user interface of the power supply are used to synchronize triggering or gating of the sensors. Yet another alternative is to sense a signal from the pulse-powered plasma itself by means of an independent floating probe 224 that is in contact with the plasma body. In this embodiment, the independent floating probe sensor may be included as part of a sensor array assembly of the invention. In any of these embodiments, the external signals can communicate the pulsing event to the sensor array processing circuitry 42 through a signal conditioner, isolator or buffer 226, for synchronous sampling of the sensor array signals. Synchronous sampling is achieved in these examples by combining the one or more external signals representative of the power pulsing event with a pulse signal from the pulsed sensor array system in order to properly gate the data acquisition from the sensor array.

Figure 13:
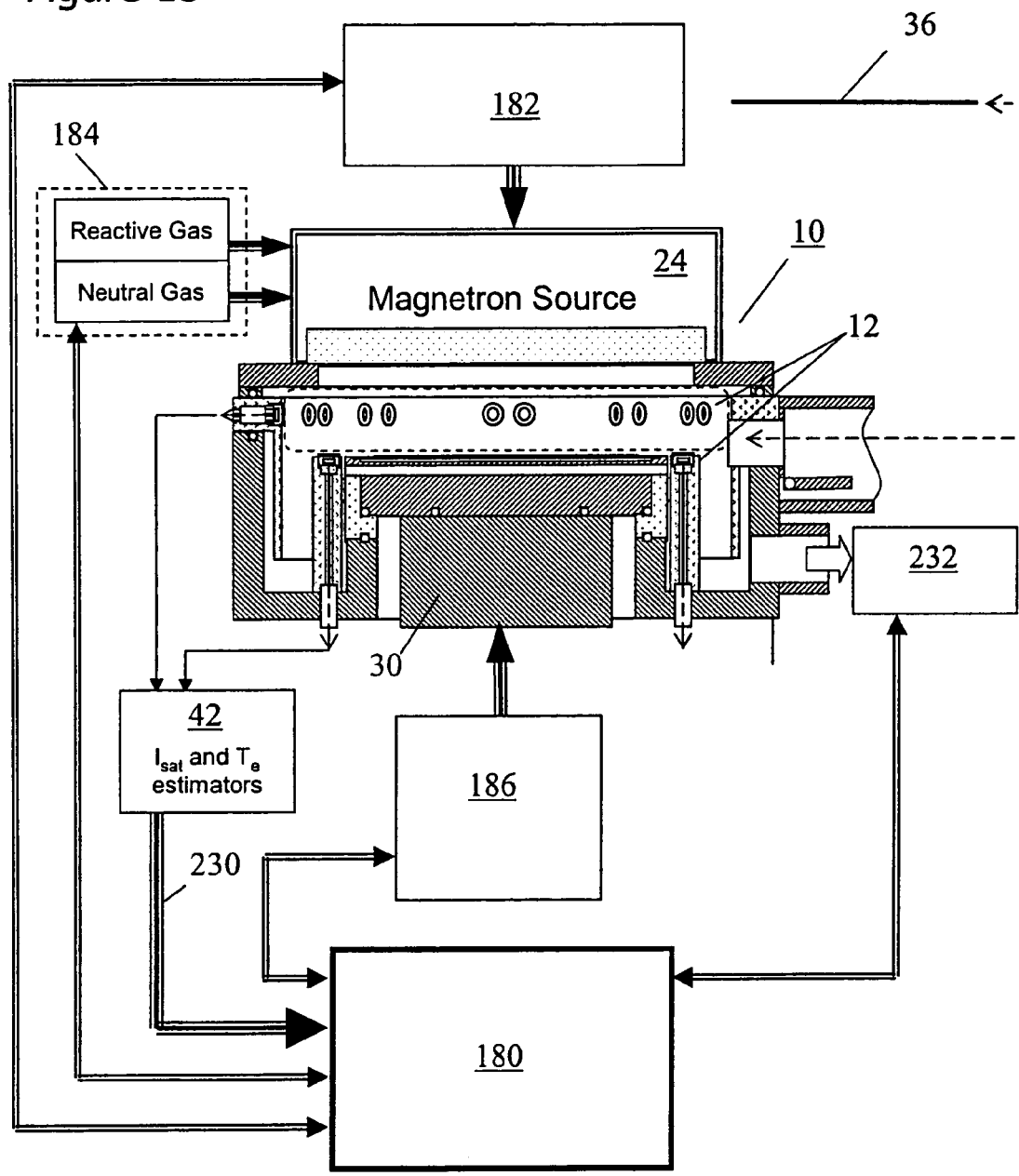
FIG. 13 illustrates a plasma processing system in accordance with an embodiment of the invention wherein conditioned DFP signals are used to monitor or control a magnetron sputtering reactive deposition process.

An embodiment of the invention employed in a reactive sputter deposition process is shown in FIG. 13. In this illustration, the plasma source 24 is a magnetron sputtering source used to deposit reactive coatings or films in the process system 10 on workpiece 36. Since magnetron sputtering systems are, by nature, multivariable, it is desirable to use the plasma sensory signals as a means to monitor and control the state of the deposition process. To this end, ion saturation current and electron temperature measurements from one or more DFP sensor arrays 12 are taken in real time from electronics 42. Alternatively, signals from other types of sensors described in accordance with the invention may be employed. The real-time measurements are provided as a series of feedback signals 230 to other subsystems through a multivariable input-output control module 180, as described above in connection with the embodiment depicted in FIG. 9. The sensory signals act as state estimators for the purpose of real-time control. For the case of reactive sputtering, the ion saturation current state estimator or estimators would provide feedback to the magnetron power supply 182, total flow levels within the flow control module 184, and pressure/pumping subsystem 232, since it is known that mean or dynamic measurements of ion saturation current are largely dependent upon power, pressure and flow settings. Similarly, a state estimator of electron temperature could be fed back to the flow control sub-system 184 so as to adjust further the ratio of neutral gas (e.g. Ar) to reactive gas (e.g. $O_2$ or $N_2$), as well as the partial pressure of the reactive gas. This is also a viable feedback path since the dynamic electron energy state as measured by electron temperature (either statically or as a function of time) is strongly dependent upon the chemical make-up and inherent electron collision physics associated with the process gases and sputter target materials. In this manner, the process input parameters, such as power, pressure, and gas flow rates, can be adjusted in real time to ensure that the process is more accurately targeted and made repeatable in production. This is an advantageous manner of operating a sputter deposition process as the process system can be made to respond to temporal drifts or disruptions and alarm the operator when plasma properties (and associated coating properties) are likely to have gone out tolerance or range of intended controllability. The invention can be applied to either reactive or metal sputtering processes (batch or in-line) configured for either single or multiple sputter cathode target materials or sputtering zones.

While the DFP sensor has been described as a preferred sensor for obtaining boundary state measurements of the plasma in connection with certain embodiments of the invention, other sensors may be incorporated into the sensor array. For example, a the invention, other sensors may be incorporated into the sensor array. For example, a sensor array of the invention may comprise photo sensors for measuring plasma optical emission spectroscopy and particle light scattering. This sensor includes any form of optically filtered semiconductor photo sensor that can discriminate the intensity of the plasma light emission over selected bandwidths associated with various excited states of molecular and atomic species within the gas discharge or plasma. With this information, relative concentrations of reactive gas species (e.g. actinometry) may be quantified, etch end-point events may be detected, or the state of the reactive gas chemistries in plasma assisted chemical vapor deposition processes may be examined. Multiple sensors may be deployed in an array in order to measure the intensity of different spectra and compact lenses or occluding optics may also be used to collect line-integrated light from a narrow angle, thereby allowing computation of information on the volumetric spatial structure of the plasma emission intensity. Components for optical emission are commercially available including pre-packaged narrow band-pass filtered photo-detectors, photo array detectors with wedge filter assemblies, and broadband spectral emissions sensors that have been integrated into a single IC package.

Yet another application of a photo detector array is the detection of light scattered from charged particulates suspended in the plasma or from particulates that have been deposited on the workpiece. These particulates can cause defects and yield problems in IC fabrication, memory media and in high performance optical coatings. In this configuration, a source of light such as an intense LED (with focusing optics) is directed through the plasma across the substrate (i.e. near the plasma sheath over the substrate) or at an incident angle onto surface of the substrate. The intensity of reflected light or scattered light is detected by the photo detector array, distributed at various angles, in order to quantify the level of particulate formation within the plasma on the substrate during processing.

The invention may also employ photo sensors for absorption spectroscopy. This sensor is a combination of a light source, such as an infrared light emitting diode, and a receiving photo detector, which may include narrow band-pass filtering. A matching set of light-source and photo-detector components are disposed on opposite sides of the array so as to detect the line-of-sight photo-absorption level of the select gases within in the processing system. Since the absorption level is proportional to line of site integrated gas species concentration, the sensor can be used to quantify bulk concentrations of various gas components in the processing system. As with the optical emission array sensor arrangement, the photo-absorption sensor array may be used to deduce reactive gas or gaseous by-product concentration profiles within the bulk of the system. Examples of important gas species that may be monitored in this manner include $SF_6$, various $C_xF_y$ species, and $SiF_4$, which is typically an etch or chamber-clean byproduct.

The invention may also employ thermal sensors for wall temperature and surface temperature chemical catalytic sensing. Wall temperatures within a processing system are dependent upon various forms of power flux including radiative heat, gas conduction, plasma light emission, charge particle flux and de-excitation and chemical reactivity and upon the thermal mass, as well as thermal management of process chamber walls or liners. Since the sensor array is part of the processing system boundary, temperature sensors may be used to monitor wall temperature dynamics, repeatability and variance. In some instances temperature sensor may be needed to serve another sensor component or sampling electronics to as a means for thermal compensation for accurate measurements.

Thermal sensors may also be used in surface catalytic measurements to monitor the relative flux, concentration, or transport of select reactive gas species. For example, the relative concentrations or surface flux of atomic hydrogen or atomic oxygen may be quantified with an array of thermal-catalytic sensors. By fabricating a thermal probe from (or coating the probe with) a specific catalytic material, the thermal energy received by the probe is related to catalytic recombination of these reactive atomic species. Secondary thermal sensors without the catalytic material may also be provided in order to de-couple effects of conductive or radiative heating from that due to the heat of the catalytic surface reaction.

In other embodiments of the invention, surface acoustic wave sensors are employed for measuring pressure, film thickness and deposition rates. Pressure is an important physical parameter within plasma processing systems in that it relates to the total concentration of gases and gas temperature. Typically, pressure is monitored only at the boundary of the process chamber at a single point. In accordance with the invention, an array of sensors for measuring pressure is used for monitoring or controlling the state of the processing system and assists in monitoring subtle spatial variation in gas pressure that result in non-uniformity of the process. An example of one type of compact pressure sensor that may be used in a sensor array of the invention is a surface acoustic wave sensor or "SAW" device, as described for example in Draft, "Acoustic Wave Sensor Technology Sensors," *Sensors*, January 2001. These piezoelectric devices may be fabricated and packaged for vacuum application and can be made to be sensitive to various physical or chemical stimuli. By disposing an array of such sensors about the chamber, the apparent state of gas pressure about the entire plasma system may be monitored.

Another applicable version of the SAW sensor is one that operates in a thickness shear mode (TSM). In this configuration, the response of piezoelectric device is sensitive to the build-up of any mass disposed upon its surface. Such sensors have commonly been used in the vacuum coating industry for measuring deposition rates and total film thicknesses. As with the aforementioned pressure sensors, an array of TSM-SAW devices may be used to monitor the rate of deposition of materials about the process chamber wall. Also, since SAW devices can be made very sensitive to changes in mass, they may also be used in detecting co-deposition of residual films that may build up during etching processes, or for detecting the existence of unwanted particles that may have been generated within the process. Such sensors may be used to monitor deposition process in real time, or to aid in determining when a chamber has been appropriately pre-seasoned or should be scheduled for preventative maintenance.

Other embodiments of the invention make use of microelectromechanical system (MEMs) components for tactile chemical sensing, mass spectrometry, ion energy and vibration sensing. One such sensor is a MEMs-based accelerometer, useful for measuring the mechanical vibrations about the plasma processing system. These micro-accelerometers provide information associated with the integrity of mechanical components or subsystems (e.g. turbo-pumps, gate valves, robotics, lift assemblies) to detect the presence of excessive loading or wear, increased friction, shock and mechanical vibration. This information may be used to trigger preventative maintenance action before mechanical failure, or to aid in tracing particle contamination problems to mechanical wear or mechanical disturbances induced by the user or external environment.

Another MEMs sensor that may be used in the present invention is a select gas concentration sensor. One example of this device is a CMOS MEMs resonant beam gas sensor, as described for example in Hagleitner et al., "A Single-Chip CMOS Resonant Beam Gas Sensor," 2001 IEEE International Solid-State Circuits Conference, Feb. 6, 2001. In this device, an oscillated, chemically sensitive cantilever beam is used to detect concentrations of select gases absorbed on the beam's surface. An array of such sensors about the walls of a chamber may be used to determine net diffusive concentrations of various gases in non-depositing processes. Further examples of MEMs sensors for use in embodiments of the invention include those designed to measure ion energy, as described for example by Blain et. al. in "High-Resolution Submicron Retarding Field Analyzer for Low-Temperature Plasma Analysis," Applied Physics Letters, Vol. 75, 1999, as well as MEMs sensors made for measuring local electric and magnetic fields and for mass spectroscopy measurements.

Although there is illustrated and described herein specific structure and details of operation, it is to be understood that these descriptions are exemplary and that alternative embodiments and equivalents may be readily made by those skilled in the art without departing from the spirit and the scope of this invention. Accordingly, the invention is intended to embrace all such alternatives and equivalents that fall within the spirit and scope of the appended claims.

What is claimed is:

1. A method of measuring plasma properties in a plasma processing system, comprising:
    a) providing a plasma processing system having a plasma chamber;
    b) providing a sensor array comprising a plurality of electrically floating sensors disposed within the plasma chamber, wherein each sensor includes first and second conductive pads;
    c) generating a plasma within the plasma chamber for use in a plasma process;
    d) collecting a plurality of measurements related to bulk properties of the plasma using the plurality of electrically floating sensors in sensor array by applying a voltage pulse to each sensor and measuring a current with each sensor;
    e) analyzing a matrix constructed from the plurality of measurements, wherein the matrix includes a plurality of diagonal terms I(i,i) and off-diagonal terms I(i,j), wherein each diagonal term I(i,i) represents a current measured between the first and second pads within a sensor in the array, and wherein each off-diagonal term I(i,j) represents a current obtained by passive current measurement at a given sensor (i) due to active pulsing of a different sensor (j); and
    f) determining one or more bulk properties of the plasma from the off-diagonal terms I(i,j) of the matrix, wherein the bulk properties include a bulk conductance of the plasma.

2. The method of claim 1 wherein the sensors are dual floating Langmuir probes.

3. The method of claim 2 wherein the array of dual floating Langmuir probes comprises a common electron return current pad.

4. The method of claim 1 wherein the sensor array is disposed along a chamber liner contained within the plasma chamber.

5. The method of claim 1 wherein the sensor array is disposed along a dielectric isolation ring contained within the plasma chamber.

6. The method of claim 1 wherein the sensor array is disposed along a focus ring contained within the plasma chamber.

7. The method of claim 1 wherein the sensor array is disposed about a workpiece chuck contained within the plasma chamber.

8. The method of claim 1 wherein the bulk properties of the plasma are determined in real time.

9. The method of claim 1 wherein the plurality of sensors is dynamically pulsed to collect the data related to bulk properties of the plasma.

10. The method of claim 9 wherein the plasma is created using a pulsed power source and the dynamic pulsing of the plurality of the sensors is synchronized with the pulsing of the pulsed power source.

11. The method of claim 1, further comprising the step of transmitting the data related to bulk properties of the plasma outside the plasma process.

12. The method of claim 11 wherein the data related to bulk properties of the plasma are transmitted wirelessly outside the plasma process.

13. The method of claim 1, further comprising the step of furnishing the data related to bulk properties of the plasma to a process system controller that controls the plasma process.

14. A system for measuring plasma properties in a plasma processing system, comprising:
    a) a sensor array disposed about a boundary of a processing region of a plasma processing system, the sensor array comprising a plurality of electrically floating sensors, wherein each sensor includes first and second conductive pads;
    b) a circuit for stimulating the plurality of sensors in the sensor array to collect a plurality of measurements related to properties of a processing plasma within the plasma chamber by applying a voltage pulse to each sensor and measuring a current with each sensor; and
    c) a processor coupled to the sensor array, wherein the processor is configured to analyze a matrix constructed from the plurality of measurements and determine one or more bulk properties of the processing plasma from a plurality of diagonal terms I(i,i) and off-diagonal terms I(i,j) of the matrix, wherein each diagonal term I(i,i) represents a current measured between the first and second pads within a sensor in the array, and wherein each off-diagonal term I(i,j) represents a current obtained by passive current measurement at a given sensor (i) due to active pulsing of a different sensor (j), and wherein the one or more bulk properties include a bulk conductance of the plasma.

15. The system of claim 14 wherein the sensors are dual floating Langmuir probes.

16. The system of claim 15 wherein the array of dual floating Langmuir probes comprises a common electron return current pad.

17. The system of claim 14 wherein the sensor array is disposed along a chamber liner contained within the plasma chamber.

18. The system of claim 14 wherein the sensor array is disposed along a dielectric isolation ring contained within the plasma chamber.

19. The system of claim 14 wherein the sensor array is disposed along a focus ring contained within the plasma chamber.

20. The system of claim 14 wherein the sensor array is disposed about a workpiece chuck contained within the plasma chamber.

21. The system of claim 14 wherein the sensors are removable from the plasma processing system.

22. The system of claim 14 wherein the one or more properties of the plasma include one or more bulk properties of the processing plasma.

23. The system of claim 14 wherein the circuit for stimulating the plurality of sensors is a dynamic pulsing circuit.

24. The system of claim 14 wherein the circuit for stimulating the plurality of sensors is a multiplex circuit.

25. The system of claim 14, further comprising wireless means for communicating the plurality of measurements between the sensor array and the processor.

26. The system of claim 14 wherein the circuit for stimulating the plurality of sensors in the sensor array is adapted to pulse a first floating sensor in the array while measuring a current to a second sensor in the array.

* * * * *